(12) United States Patent
Ahn et al.

(10) Patent No.: US 10,686,028 B2
(45) Date of Patent: Jun. 16, 2020

(54) FOLDABLE DISPLAY DEVICE

(71) Applicant: SAMSUNG DISPLAY CO., LTD., Yongin-si, Gyeonggi-do (KR)

(72) Inventors: Sung Sang Ahn, Hwaseong-si (KR); Seung-Hwa Ha, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/243,813

(22) Filed: Jan. 9, 2019

(65) Prior Publication Data
US 2019/0237532 A1 Aug. 1, 2019

(30) Foreign Application Priority Data
Jan. 30, 2018 (KR) ........................ 10-2018-0011266

(51) Int. Cl.
| | |
|---|---|
| *H05K 1/00* | (2006.01) |
| *H01L 27/32* | (2006.01) |
| *G02F 1/1333* | (2006.01) |
| *H05K 1/11* | (2006.01) |
| *H05K 1/02* | (2006.01) |
| *H05K 1/18* | (2006.01) |

(52) U.S. Cl.
CPC .... *H01L 27/3276* (2013.01); *G02F 1/133305* (2013.01); *H05K 1/028* (2013.01); *H05K 1/118* (2013.01); *H05K 1/189* (2013.01); *H01L 2251/5338* (2013.01)

(58) Field of Classification Search
CPC ... G02F 1/133305; G02F 2001/133314; G02F 2201/50; G06F 1/1618; G06F 1/1652; G06F 1/1681; G09F 9/301; H01L 2251/5338; H01L 27/3276; H01L 51/0097; H05K 1/028; H05K 1/118; H05K 1/189

See application file for complete search history.

(56) References Cited

U.S. PATENT DOCUMENTS 8,248,764 B2 * 8/2012 Hassemer ............. H04M 1/022
  361/679.01
9,798,359 B2 * 10/2017 Seo ........................ G06F 1/1652
(Continued)

FOREIGN PATENT DOCUMENTS

KR    10-1467857       12/2014
KR    10-2015-0142290 A   12/2015
(Continued)

*Primary Examiner* — Yuriy Semenenko
(74) *Attorney, Agent, or Firm* — Lewis Roca Rothgerber Christie LLP (57) ABSTRACT

A display device according to an exemplary embodiment includes a display panel including a bending portion, and a folding unit supporting the display panel, the display device being capable of being in-folded and out-folded. The folding unit includes: a first supporting plate including a first supporting portion; a second supporting plate including a second supporting portion spaced apart from the first supporting portion; a first elastic member including a first wing portion protruded from the first supporting portion; and a second elastic member including a second wing portion protruded from the second supporting portion. The bending portion includes a first portion attached to the first wing portion and a second portion attached to the second wing portion.

20 Claims, 10 Drawing Sheets

(56) References Cited

U.S. PATENT DOCUMENTS

| | | | | |
|---|---|---|---|---|
| 10,222,835 B2* | 3/2019 | Lim | ................... | H04M 1/0214 |
| 2014/0042293 A1* | 2/2014 | Mok | ................... | G09F 9/301 |
| | | | | 248/682 |
| 2015/0378397 A1* | 12/2015 | Park | ................... | G06F 1/1652 |
| | | | | 361/679.27 |
| 2018/0232011 A1* | 8/2018 | Jiang | ................... | G06F 1/1652 |
| 2019/0179373 A1* | 6/2019 | Cheng | ................ | H04M 1/0268 |
| 2019/0369671 A1* | 12/2019 | Seo | ................... | G06F 1/1681 |
| 2020/0020255 A1* | 1/2020 | Yoon | ................... | G06F 1/1652 |

FOREIGN PATENT DOCUMENTS

| | | |
|---|---|---|
| KR | 10-1753615 | 7/2017 |
| KR | 10-1762141 | 7/2017 |

\* cited by examiner

FOLDABLE DISPLAY DEVICE

CROSS-REFERENCE TO RELATED APPLICATION

This application claims priority to and the benefit of Korean Patent Application No. 10-2018-0011266, filed on Jan. 30, 2018 in the Korean Intellectual Property Office, the entire content of which is incorporated herein by reference.

BACKGROUND

1. Field

Aspects of embodiments of this disclosure relate to a foldable display device.

2. Description of the Related Art

Display devices such as an organic light emitting diode display and a liquid crystal display are manufactured by generating a plurality of layers and elements on a substrate. Glass may be used for the substrate of the display device. However, the glass substrate is heavy and easily broken. Further, the glass substrate is rigid such that it is difficult to deform the display device. Recently, display devices using a flexible substrate that is light, strong against impacts, and is easily deformed have been developed.

The flexible display device may be classified into a bendable display device, a foldable display device, a rollable display device, and a stretchable display device, depending on its application and form. Among them, the foldable display device may fold and unfold the display panel displaying an image like a cover of a book. However, if the display device is repeatedly folded and unfolded, a deformation may be generated in a portion (herein referred to as a bending portion) where the display panel is bent, and the bending portion may be degraded or damaged.

The above information disclosed in this Background section is only for enhancement of understanding of the background of the invention and, therefore, it may contain information that does not form the prior art that is already known in this country to a person of ordinary skill in the art.

SUMMARY

According to an aspect of exemplary embodiments, a foldable display device in which damage of a display panel is prevented or substantially prevented is provided.

A display device according to one or more exemplary embodiments includes: a display panel including a bending portion, and a folding unit supporting the display panel, and is capable of being in-folded and out-folded. The folding unit may include: a first supporting plate including a first supporting portion; a second supporting plate including a second supporting portion spaced apart from the first supporting portion; a first elastic member including a first wing portion protruded from the first supporting portion; and a second elastic member including a second wing portion protruded from the second supporting portion. The bending portion may include a first portion attached to the first wing portion and a second portion attached to the second wing portion.

The first wing portion and the second wing portion may be respectively protruded from the first supporting portion and the second supporting portion in a direction to face each other.

The first wing portion and the second wing portion may each have a thickness that decreases farther away from the first supporting portion and the second supporting portion, respectively.

In an unfolded state of the foldable display device, the first wing portion and the second wing portion may each have a trapezoidal cross-sectional shape, the first wing portion and the second wing portion may each have a cross-sectional shape in which a slope of a lower surface gradually decreases farther away from the first supporting portion and the second supporting portion, respectively, or the first wing portion and the second wing portion may each have a triangular cross-sectional shape.

In an unfolded state of the foldable display device, an upper surface of the first wing portion and an upper surface of the first supporting portion may form a flat surface, and an upper surface of the second wing portion and an upper surface of the second supporting portion may form a flat surface.

In an unfolded state of the foldable display device, a first distance between the first supporting portion and the second supporting portion is equal to or larger than $\pi R$, where $\pi$ is pi, and R is a curvature of the bending portion during out-folding of the foldable display device, and a second distance between the first wing portion and the second wing portion may be larger than 0 and smaller than $\pi R$.

The first elastic member and the second elastic member may be respectively positioned over at least a part of facing edges of the first supporting portion and the second supporting portion.

The first elastic member may include a first fixing portion coupled to the first supporting portion, and the second elastic member may include a second fixing portion coupled to the second supporting portion.

The display panel may include a first flat portion attached to the first supporting portion and a second flat portion attached to the second supporting portion.

The bending portion may be positioned between the first flat portion and the second flat portion.

The foldable display device may further include a first hinge and a second hinge positioned at respective sides of the first supporting plate and the second supporting plate, the first supporting plate may include a first step portion positioned at respective sides of the first supporting portion, the second supporting plate may include a second step portion positioned at respective sides of the second supporting portion, and the first hinge and the second hinge may respectively include a first hinge pin coupled to the first step portion and a second hinge pin coupled to the second step portion.

A foldable display device according to one or more exemplary embodiments includes a display panel and a folding unit and is capable of being folded in an out-folding state in which the display panel is exposed to an outside and an in-folding state in which the display panel is positioned inside. The folding unit may include: a first supporting plate and a second supporting plate forming a pair with each other; and a first elastic member and a second elastic member respectively positioned at facing edges of the first supporting plate and the second supporting plate. A portion of the display panel may be attached to the first elastic member and the second elastic member.

The display panel may include a first flat portion, a second flat portion, and a bending portion between the first flat portion and the second flat portion, and at least a portion of the bending portion may be attached to the first elastic member and the second elastic member.

The first supporting plate may include a first supporting portion, and the second supporting plate may include a second supporting portion spaced apart from the first supporting portion. The first elastic member may be fixed to the first supporting portion, and the second elastic member may be fixed to the second supporting portion.

The first elastic member may include a first fixing portion coupled to the first supporting portion, and a first wing portion protruded from the first supporting portion, and the second elastic member may include a second fixing portion coupled to the second supporting portion, and a second wing portion protruded from the second supporting portion.

The bending portion may include a first portion attached to the first wing portion, a second portion attached to the second wing portion, and a third portion positioned between the first portion and the second portion.

The first wing portion and the second wing portion may each have a thickness that decreases farther away from the first supporting portion and the second supporting portion, respectively.

According to an aspect of exemplary embodiments, when changing the display device from the first folding state to the second folding state, the display panel may be prevented or substantially prevented from being backwardly curved by the deformation of the display panel, accordingly preventing or substantially preventing degradation and damage of the display panel.

DETAILED DESCRIPTION

Herein, the present invention will be described more fully with reference to the accompanying drawings, in which some exemplary embodiments of the invention are shown. As those skilled in the art would realize, the described embodiments may be modified in various different ways, all without departing from the spirit or scope of the present invention.

Parts that are irrelevant to the description may be omitted to clearly describe the present invention, and the same elements will be designated by the same reference numerals throughout the specification.

In addition, the size and thickness of each configuration shown in the drawings may be arbitrarily shown for better understanding and ease of description, but the present invention is not limited thereto. In the drawings, the thicknesses of layers, films, panels, regions, etc., may be exaggerated for clarity. In the drawings, for better understanding and ease of description, the thicknesses of some layers and areas may be exaggerated.

It is to be understood that when an element, such as a layer, film, region, or substrate is referred to as being "on" another element, it may be directly on the other element or one or more intervening elements may also be present. In contrast, when an element is referred to as being "directly on" another element, there are no intervening elements present.

In addition, unless explicitly described to the contrary, the word "comprise" and variations such as "comprises" or "comprising" are to be understood to imply the inclusion of stated elements but not the exclusion of any other elements.

Further, in the specification, the phrase "in a plan view" means when an object portion is viewed from above, and the phrase "in a cross-sectional view" means when a cross-section taken by vertically cutting an object portion is viewed from the side.

Now, a display device according to an exemplary embodiment of the present invention will be described with reference to accompanying drawings. Although an organic light emitting diode display is described as a display device, the present invention is not limited thereto, and the present invention may be applied to other display devices, such as a liquid crystal display.

Figure 1:
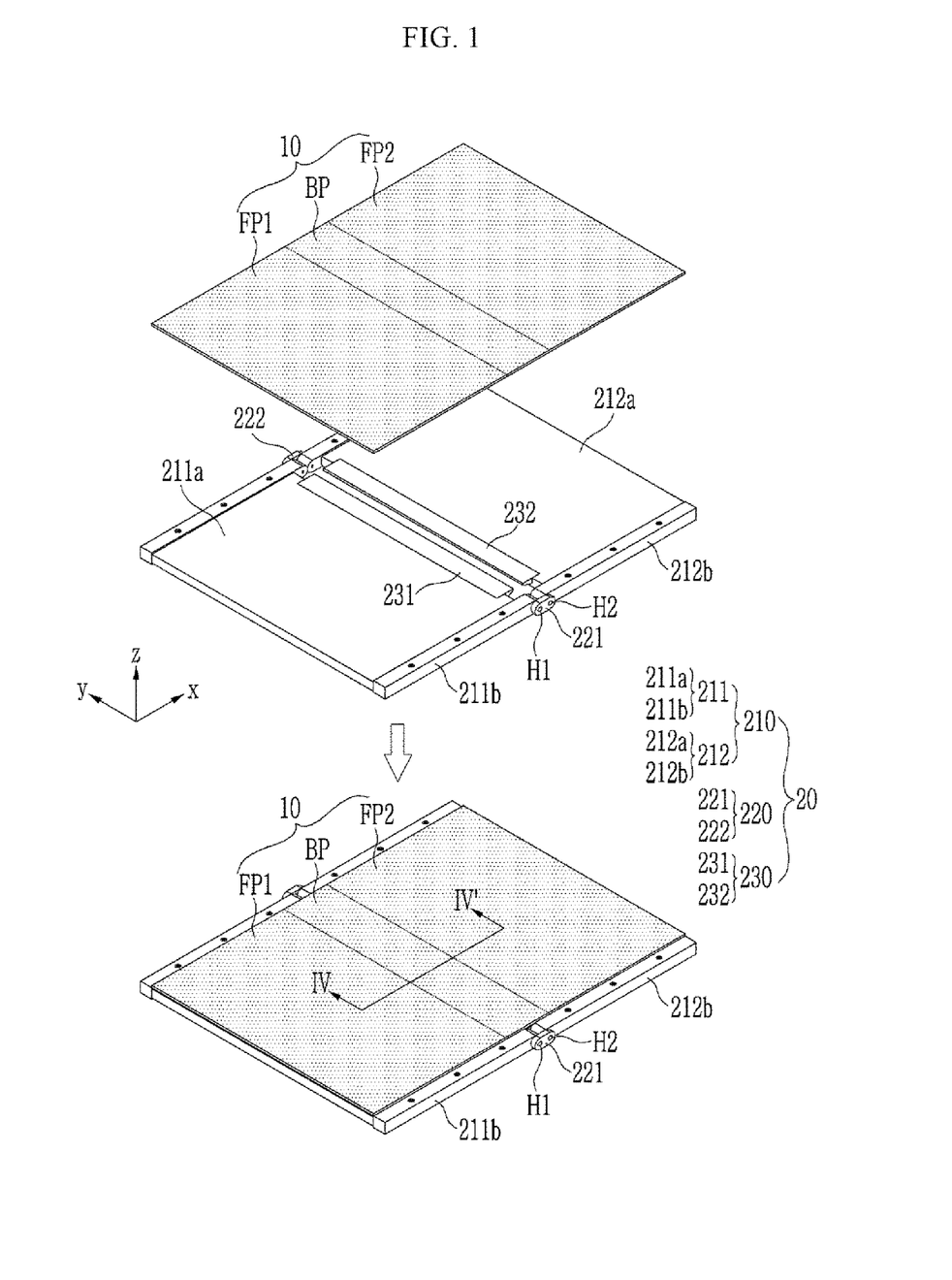
FIG. 1 is a perspective view of a display device according to an exemplary embodiment, shown in an unfolded state.
Figure 2:
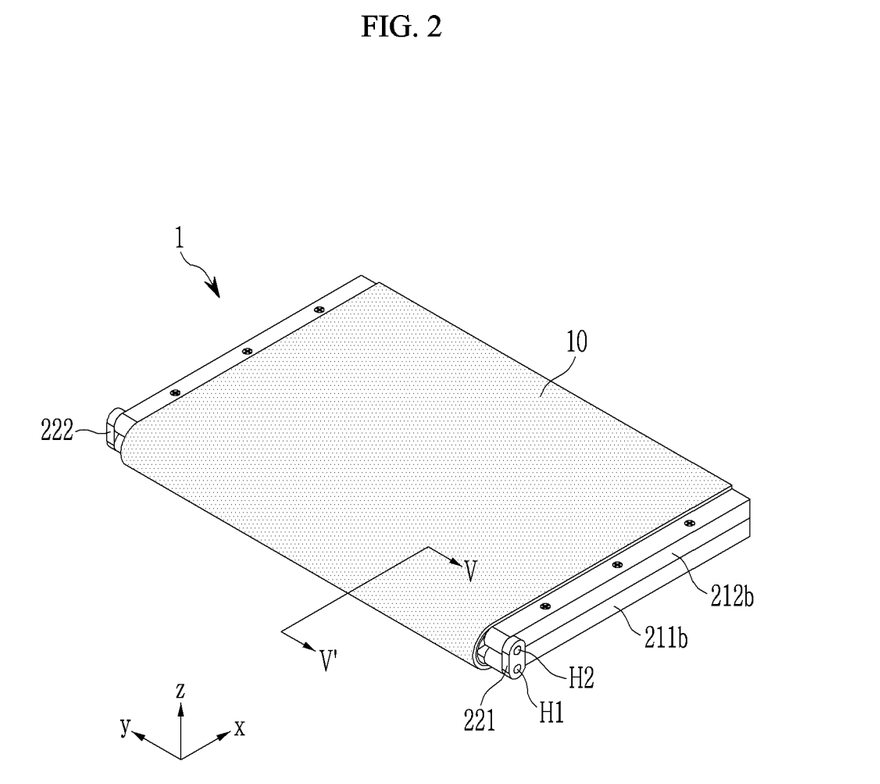
FIG. 2 is a perspective view of the display device of FIG. 1, shown in a first folding state.
Figure 3:
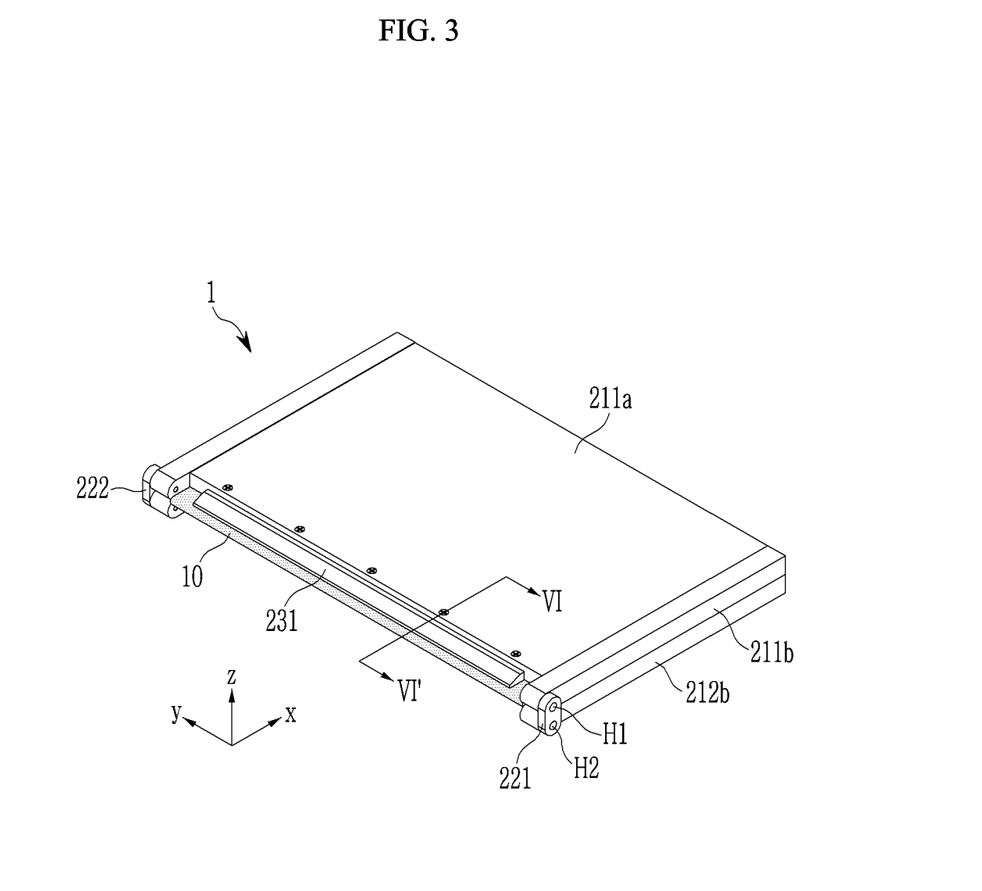
FIG. 3 is a perspective view of the display device of FIG. 1, shown in a second folding state.
Figure 4:
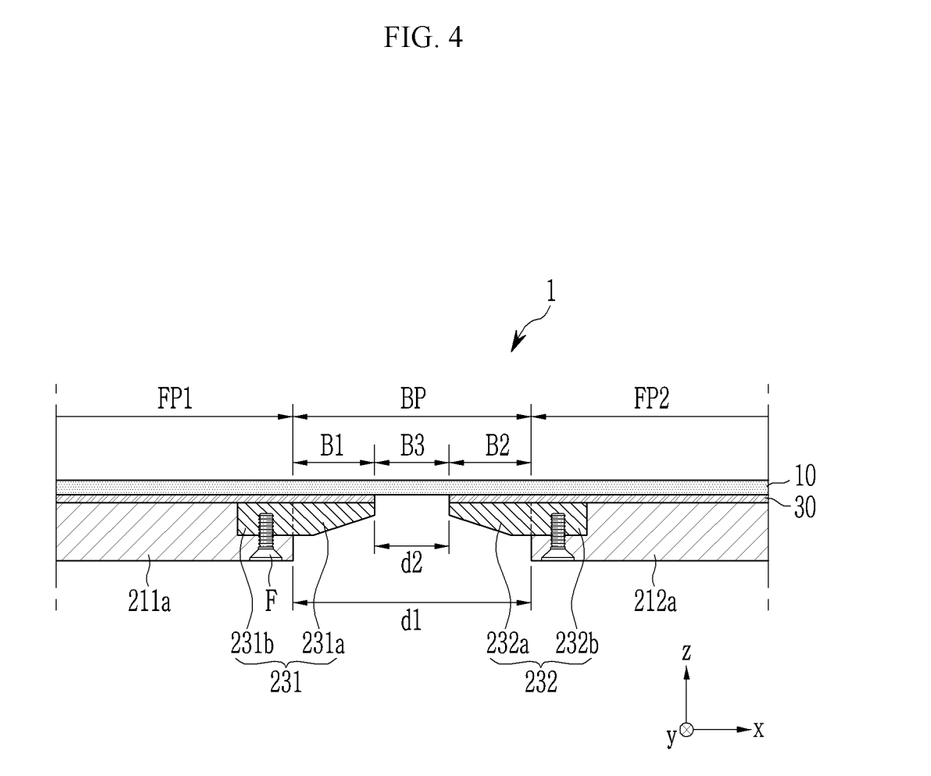
FIG. 4 is a cross-sectional view taken along the line IV-IV' of FIG. 1, according to an exemplary embodiment.
Figure 5:
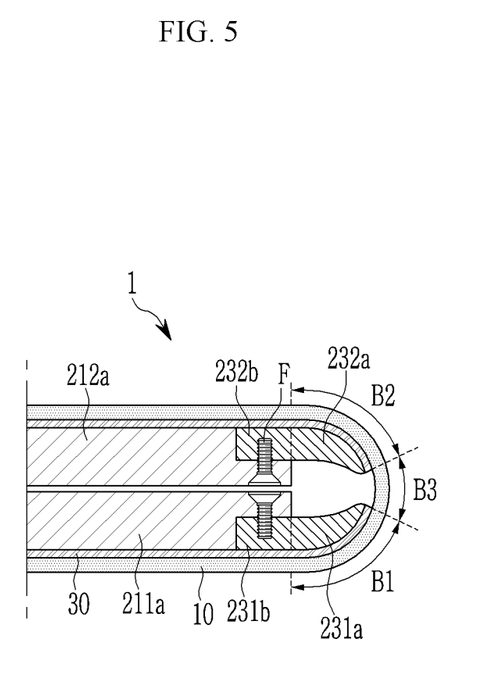
FIG. 5 is a cross-sectional view taken along the line V-V' of FIG. 2, according to an exemplary embodiment.
Figure 6:
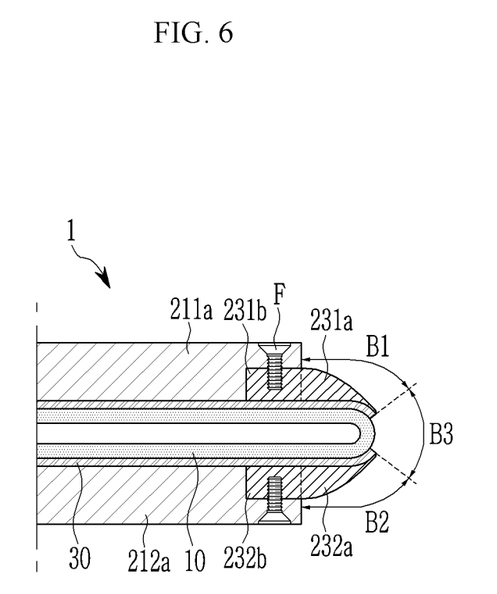
FIG. 6 is a cross-sectional view taken along the line VI-VI' of FIG. 3, according to an exemplary embodiment.

FIG. 1 is a perspective view of a display device according to an exemplary embodiment, shown in an unfolded state; FIG. 2 is a perspective view of the display device of FIG. 1, shown in a first folding state; and FIG. 3 is a perspective view of the display device of FIG. 1, shown in a second folding state. FIG. 4 is a cross-sectional view taken along the line IV-IV' of FIG. 1, according to an exemplary embodiment; FIG. 5 is a cross-sectional view taken along the line V-V' of FIG. 2, according to an exemplary embodiment; and FIG. 6 is a cross-sectional view taken along the line VI-VI' of FIG. 3, according to an exemplary embodiment. In FIG. 1, an upper view shows a state before a display panel 10 is attached to a folding unit 20, and a lower view shows a state after the attachment.

Referring to FIG. 1 to FIG. 6, a display device 1 includes the display panel 10 and the folding unit 20. In the display device 1, as shown in FIG. 1 and FIG. 4, the display panel 10 may be completely unfolded to be flat. As shown in FIG. 2 and FIG. 5, the display device 1 may be folded (herein referred to as out-folding or first folding) such that the display panel 10 is exposed (e.g., completely exposed) to the outside. As shown in FIG. 3 and FIG. 6, the display device 1 may be folded (herein referred to in-folding or second folding) such that most of the display panel 10 is positioned in the folding unit 20. The display device 1, for example, may be in the unfolded state or in the first folding state when in use, or may be in the second folding state when not in use.

The display panel 10 is a panel that becomes a screen displaying an image in the display device 1. The screen of the display panel 10 is a surface opposite to the surface attached to the folding unit 20. The display panel 10 is a flexible panel of which at least a portion may be bendable. In an embodiment, the display panel 10 includes a first flat portion FP1, a second flat portion FP2, and a bending portion BP. The first flat portion FP1 and the second flat portion FP2 are portions that are not substantially bent, and the bending portion BP is a portion that is bent during the folding of the display device 1.

The folding unit 20 includes a supporting plate set 210 and a hinge set 220 as a mechanism that enables the folding of the display panel 10 while supporting the display device 1.

The supporting plate set 210 includes a first supporting plate 211 and a second supporting plate 212 forming a pair with each other. The supporting plate set 210, as shown in FIG. 2 and FIG. 5, may be folded such that the display panel 10 is positioned outside the first supporting plate 211 and the second supporting plate 212, or, as shown in FIG. 3 and FIG. 6, may be folded such that the display panel 10 may be positioned between the first supporting plate 211 and the second supporting plate 212.

The first supporting plate 211 may include a first supporting portion 211a to which the display panel 10 is attached, and a first step portion 211b at both edges of the first supporting portion 211a. The second supporting plate 212 may include a second supporting portion 212a to which the display panel 10 is attached, and a second step portion 212b at both edges of the second supporting portion 212a. In the state in which the display device 1 is unfolded, the first supporting portion 211a and the second supporting portion 212a are separated or spaced apart by a first distance d1, and the upper surface of the first supporting portion 211a and the upper surface of the second supporting portion 212a may form one plane surface, or may be coplanar.

For the folding in both directions of the display device 1, the hinge set 220 includes a first hinge 221 and a second hinge 222 respectively positioned at both sides of the first supporting plate 211 and the second supporting plate 212. In an embodiment, each of the first hinge 221 and the second hinge 222 includes a first hinge pin H1 coupled to the first step portion 211b of the first supporting plate 211, and a second hinge pin H2 coupled to the second step portion 212b of the second supporting plate 212. The first supporting plate 211 may be pivoted based on the first hinge pin H1, and the second supporting plate 212 may be pivoted based on the second hinge pin H2.

The folding unit 20 includes an elastic member set 230 positioned at facing edges of the first supporting plate 211 and the second supporting plate 212, and, in further detail, at facing edges of the first supporting portion 211a and the second supporting portion 212a. The elastic member set 230 may be formed of a material having elasticity, such as a rubber (e.g., urethane rubber, silicone rubber, natural rubber, etc.) or an elastomer.

The elastic member set 230 includes a first elastic member 231 fixed to the first supporting portion 211a and a second elastic member 232 fixed to the second supporting portion 212a. The first elastic member 231 and the second elastic member 232 may be positioned throughout at least a part of the facing edges of the first supporting portion 211a and the second supporting portion 212a. The first elastic member 231 includes a first wing portion 231a protruded from the first supporting portion 211a and a first fixing portion 231b coupled with the first supporting portion 211a. The second elastic member 232 includes a second wing portion 232a protruded from the second supporting portion 212a and a second fixing portion 232b coupled with the second supporting portion 212a. In an embodiment, the first wing portion 231a and the first fixing portion 231b are integrally formed, and the second wing portion 232a and the second fixing portion 232b are integrally formed. The first fixing portion 231b overlaps the first supporting portion 211a, and the first wing portion 231a does not overlap the first supporting portion 211a. The second fixing portion 232b overlaps the second supporting portion 212a, and the second wing portion 232a does not overlap the second supporting portion 212a.

The first wing portion 231a and the second wing portion 232a are protruded from the first supporting portion 211a and the second supporting portion 212a in a direction to face each other. In the state that the display device 1 is unfolded, the first wing portion 231a and the second wing portion 232a are separated by a second distance d2. In the state that the display device 1 is unfolded, an upper surface of the first wing portion 231a and the upper surface of the first supporting portion 211a form a flat surface or are coplanar, and an upper surface of the second wing portion 232a and the upper surface of the second supporting portion 212a form a flat surface or are coplanar. In an embodiment, each of the first wing portion 231a and the second wing portion 232a has a shape such that the thickness decreases toward the end that is farther from the first supporting portion 211a and the second supporting portion 212a. In the shown exemplary embodiment, the first wing portion 231a and the second wing portion 232a have a trapezoidal cross-sectional shape, that is, a trapezoidal or approximately trapezoidal cross-sectional shape.

In an embodiment, the first fixing portion 231b is coupled to the first supporting portion 211a by a fixing means "F" penetrating the first supporting portion 211a, such as a screw, and the second fixing portion 232b is coupled to the second supporting portion 212a by a fixing means "F" penetrating the second supporting portion 212a, such as a screw. By the first fixing portion 231b and the second fixing portion 232b, the first elastic member 231 and the second elastic member 232 respectively including the first wing portion 231a and the second wing portion 232a may be fixed to the first supporting portion 211a and the second supporting portion 212a, respectively.

In an embodiment, the display panel 10 is attached to the folding unit 20 by an adhesive layer 30. In further detail, the first flat portion FP1 of the display panel 10 is attached to the first supporting portion 211a of the first supporting plate 211, and the second flat portion FP2 is attached to the second supporting portion 212a of the second supporting plate 212. A portion of the first flat portion FP1 may be attached to the first fixing portion 231b, and a portion of the second flat portion FP2 may be attached to the second fixing portion 232b. Only a portion of the bending portion BP of the display panel 10 is attached to the folding unit 20. That is, the bending portion BP includes a first portion B1 attached to the first wing portion 231a of the first elastic member 231, a second portion B2 attached to the second wing portion 232a of the second elastic member 232, and a third portion B3 between the first portion B1 and the second portion B2. The third portion B3 of the bending portion BP is not attached to the folding unit 20. In an embodiment in which the first wing portion 231a and the second wing portion 232a are in contact or nearly in contact with each other, the bending portion BP may not include the third portion B3. When the display device 1 is in the unfolded state, the first wing portion 231a and the second wing portion 232a may support the first portion B1 and the second portion B2 of the bending portion BP by the elasticity to be flat.

Referring to FIG. 5, in the out-folding state of the display device 1, such that the display panel 10 is exposed to the outside, the bending portion BP of the display panel 10 is bent. The first portion B1 and the second portion B2 of the bending portion BP, which are respectively attached to the first wing portion 231a and the second wing portion 232a, are bent along with the first wing portion 231a and the second wing portion 232a. Since the first wing portion 231a and the second wing portion 232a are formed of the elastic material and the thickness gradually decreases toward the end, the bending portion BP may be bent to form a semicircle, that is, a semicircle or approximate semicircle, in a cross-section as shown. Even if the first wing portion 231a and the second wing portion 232a are formed of the elastic material, if the thickness is uniform, excessive stress may be generated at a boundary part of the first portion B1 and the third portion B3 corresponding to the end portion of the first wing portion 231a and at a boundary part of the second portion B2 and the third portion B3 corresponding to the end portion of the second wing portion 232a, and the bending portion BP may thereby be damaged. In an embodiment, the first flat portion FP1 and the second flat portion FP2 may also be bent; however, the first flat portion FP1 and the second flat portion FP2 are attached to the flat first supporting portion 211a and second supporting portion 212a such that they are not substantially bent.

Referring to FIG. 6, in the state that the display panel 10 is positioned such that the display device 1 is in-folded, the bending portion BP of the display panel 10 is bent. The first flat portion FP1 and the second flat portion PF2 of the display panel 10 may be positioned to overlap the first supporting portion 211a and the second supporting portion 212a, and the bending portion BP may be positioned to not overlap the first supporting portion 211a and the second supporting portion 212a. Since the first portion B1 and the second portion B2 of the bending portion BP may be respectively attached to the first wing portion 231a and the second wing portion 232a, and the first wing portion 231a and the second wing portion 232a are formed of the elastic material of which the thickness decreases toward the end, the bending portion BP may be bent such to form a semicircle, that is, a semicircle or approximate semicircle, in a cross-section as shown.

Figure 7:
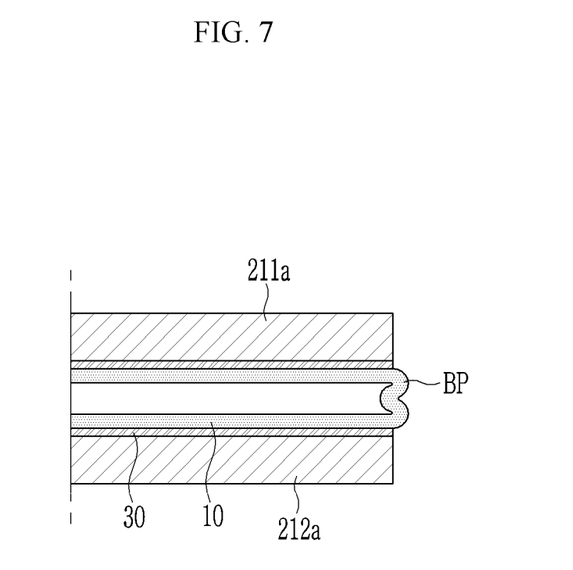
FIG. 7 is a cross-sectional view of a region corresponding to FIG. 6 in a display device without an elastic member.

If the out-folding and the in-folding of the display device 1 are repeated, the bending portion BP of the display panel 10 may become weak and a deformation such that some layers constituting the display panel 10 are stretched etc. may be generated. As a result, referring to FIG. 7 showing an in-folding state of a display device without the elastic member set 230, the bending portion BP of the display panel 10 may include portions which are bent in opposite directions and the bending portion BP may be bent to form a shape like the number "3." Accordingly, the bending portion BP may include a portion that is excessively bent, and thus the bending portion BP may be damaged. However, according to one or more exemplary embodiments of the present invention, as shown in FIG. 6, since the first wing portion 231a and the second wing portion 232a hold the first portion B1 and the second portion B2 of the bending portion BP in the in-folding state of the display device 1, it is possible to prevent or substantially prevent the bending portion BP from being bent in opposite directions.

In an embodiment, to prevent or substantially prevent the bending portion BP of the display panel 10 from being damaged during the out-folding of the display device 1, the first distance d1 between the first supporting portion 211a and the second supporting portion 212a may be set. In an embodiment, for example, the first distance d1 is determined as follows for the curvature radius R of the bending portion BP during the out-folding:

$$d1 \geq \pi R \text{ (where } \pi \text{ is pi)}.$$

Herein, $\pi R$ may correspond to a width of the bending portion BP. That is, the first distance d1 is equal to or greater than the width of the bending portion BP, such that a tension is not applied to the bending portion BP during the out-folding, and damage due to the stress generation of the bending portion BP may be prevented or substantially prevented.

In an embodiment, the second distance d2 between the first wing portion 231a and the second wing portion 232a is as follows:

$$0 < d2 < \pi R.$$

The above equation represents that the first wing portion 231a and the second wing portion 232a are protruded from the first supporting portion 211a and the second supporting portion 212a and the first wing portion 231a and the second wing portion 232a are not connected to each other.

In an embodiment, a curvature radius r of the bending portion BP during in-folding may be smaller than the curvature radius R of the bending portion BP during the out-folding, but, in an embodiment, they may be approximately equal.

In the above-described exemplary embodiment, the elastic member set 230 is fixed to the supporting plate set 210 by the fixing means "F," such as the screw, and the first wing portion 231a and the second wing portion 232a have the trapezoidal cross-sectional shape. However, the elastic member set 230 may be fixed to the supporting plate set 210 by other devices and methods, and the first wing portion 231a and the second wing portion 232a may have other cross-sectional shapes. For example, some exemplary embodiments are described with reference to FIG. 8 and FIG. 9 while focusing on differences from the above-described exemplary embodiment.

Figure 8:
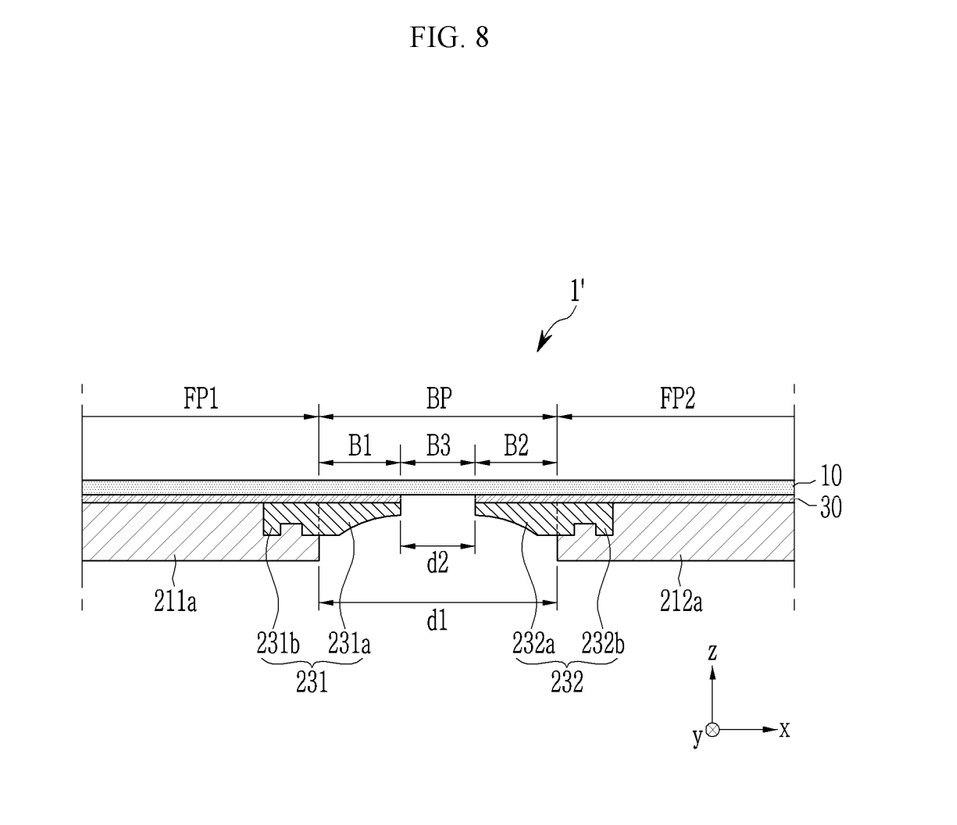
FIG. 8 and FIG. 9 are cross-sectional views taken along a line corresponding to the line IV-IV' of FIG. 1 according to exemplary embodiments, respectively.
Figure 9:
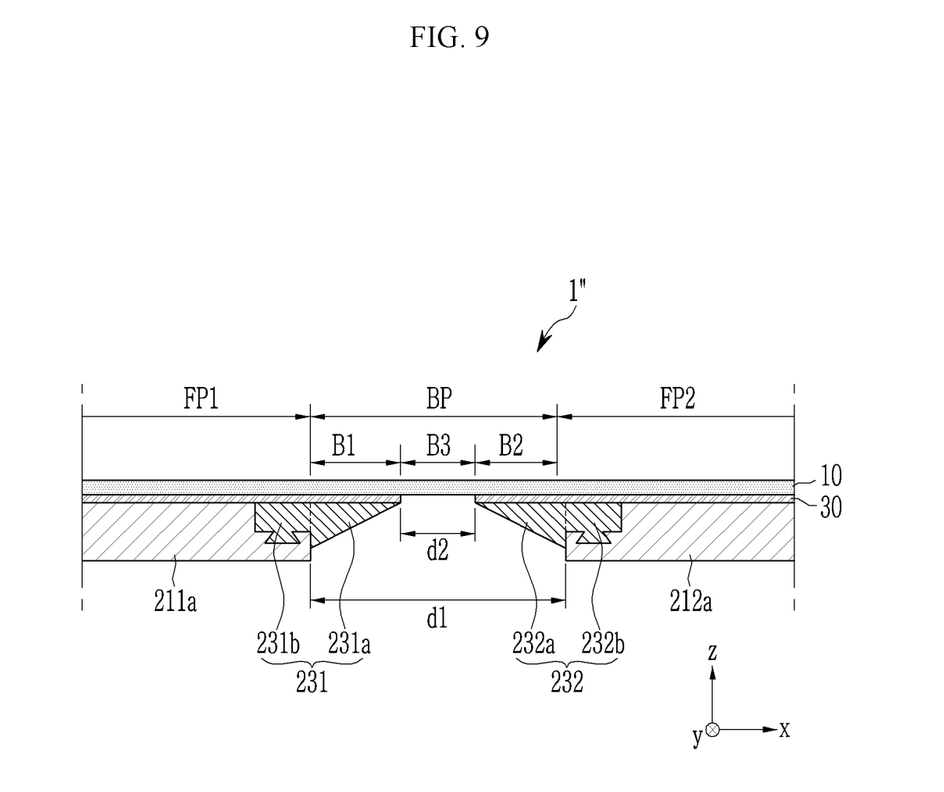

FIG. 8 and FIG. 9 are cross-sectional views taken along a line corresponding to the line IV-IV' of FIG. 1 according to exemplary embodiments, respectively.

Referring to FIG. 8 and FIG. 9, the elastic member set 230 includes the first elastic member 231 and the second elastic member 232. The first elastic member 231 includes a first wing portion 231a and a first fixing portion 231b, and the second elastic member 232 includes a second wing portion 232a and a second fixing portion 232b. The first wing portion 231a and the second wing portion 232a have a shape such that the thickness decreases away from the first supporting portion 211a and the second supporting portion 212a, like the above-described exemplary embodiment. However, in a display device 1' according to the exemplary embodiment of FIG. 8, the first wing portion 231a and the second wing portion 232a have a cross-sectional shape in which a slope of a lower surface of the thinned portion decreases toward the end. In a display device 1" according to the exemplary embodiment of FIG. 9, the first wing portion 231a and the second wing portion 232a have a triangular cross-sectional shape, that is, a triangular or approximately triangular cross-sectional shape. The cross-sectional shape may be selected depending on the material of the first wing portion 231a and the second wing portion 232a, the elasticity, the length, the characteristics of the bending portion BP, etc.

Referring to FIG. 8, in an embodiment, the first fixing portion 231b and the second fixing portion 232b are respectively fixed to the first supporting portion 211a and the second supporting portion 212a by an attachment means, such as an adhesive. To increase the adhesion area, a lower surface of the first fixing portion 231b and the second fixing portion 232b may have a shape including protrusions and depressions, and the first supporting portion 211a and the second supporting portion 212a may have a shape including protrusions and depressions corresponding thereto.

Referring to FIG. 9, in an embodiment, the first supporting portion 211a and the second supporting portion 212a have grooves in which a width decreases toward the top, and the first fixing portion 231b and the second fixing portion 232b have protrusions in which a width widens toward the bottom according to the grooves. In this case, without the use of another attachment means, the fixing may be realized by a method in which the protrusions of the first fixing portion 231b and the second fixing portion 232b are inserted into the grooves of the first supporting portion 211a and the second supporting portion 212a, respectively. Since the first fixing portion 231b and the second fixing portion 232b are formed of an elastic material, the above-described insertion fitting may be possible, and is difficult to be detached after the insertion due to the shape of the grooves of the first supporting portion 211a and the second supporting portion 212a and the protrusions of the first fixing portion 231b and the second fixing portion 232b.

Herein, a cross-sectional structure of the display panel 10 according to an exemplary embodiment is described in further detail with reference to FIG. 10.

Figure 10:
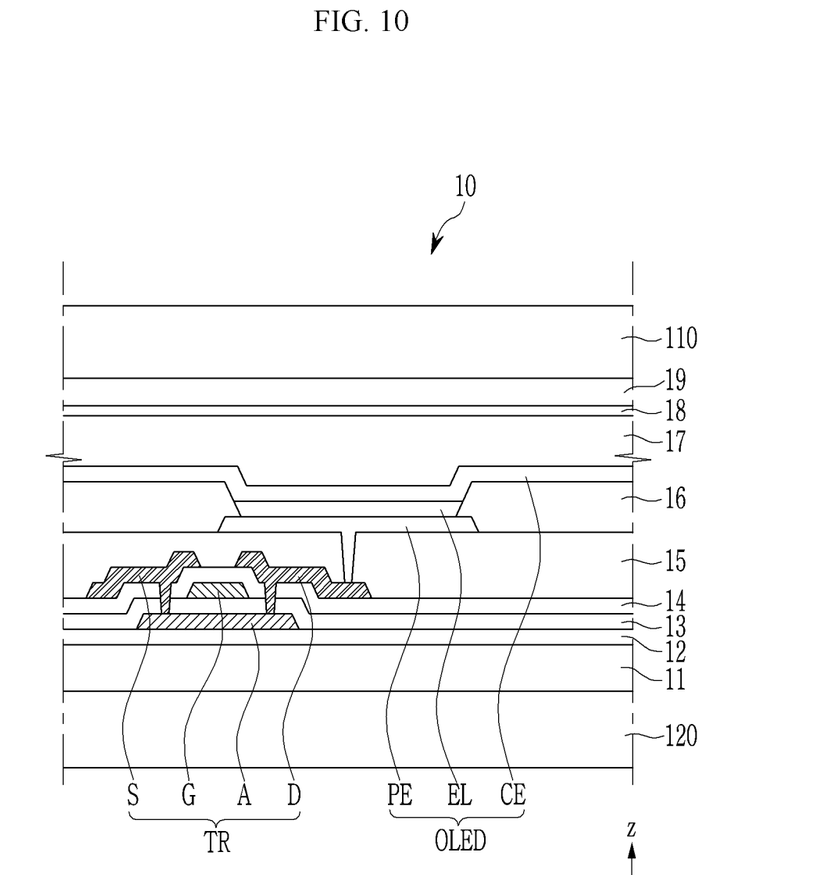
FIG. 10 is a cross-sectional view of a display panel according to an exemplary embodiment.

FIG. 10 is a cross-sectional view showing an example of a stacking structure of the display panel 10 according to an exemplary embodiment. The cross-sectional view shown in FIG. 10 may correspond to one pixel area. The display panel 10 includes a substrate 11, a transistor TR formed on the substrate 11, and an organic light emitting diode OLED connected to the transistor TR.

The substrate 11 may be a flexible substrate made of a polymer, such as polyimide, polyamide, polyethylene terephthalate, etc. The substrate 11 may include a barrier layer preventing or substantially preventing moisture, oxygen, etc., from being penetrated from the outside.

A buffer layer 12 is positioned on the substrate 11. The buffer layer 12 may prevent or substantially prevent an impurity from being diffused from the substrate 11 to a semiconductor layer "A" in a process of forming the semiconductor layer "A," and may reduce the stress applied to the substrate 11.

The semiconductor layer "A" of the transistor TR is positioned on the buffer layer 12, and a gate insulating layer 13 is positioned on the semiconductor layer "A." The semiconductor layer "A" includes a source region and a drain region, and a channel region therebetween. The semiconductor layer "A" may include a polysilicon, an oxide semiconductor, or amorphous silicon. The gate insulating layer 13 may include an inorganic insulating material, such as a silicon oxide, a silicon nitride, etc.

A gate conductor including a gate electrode "G" of the transistor TR is positioned on the gate insulating layer 13. The gate conductor, for example, may include a metal, such as molybdenum (Mo), copper (Cu), aluminum (Al), silver (Ag), chromium (Cr), tantalum (Ta), titanium (Ti), or a metal alloy thereof.

An interlayer insulating layer 14 is positioned on the gate conductor. In an embodiment, the interlayer insulating layer 14 may include an inorganic insulating material.

A data conductor including a source electrode "S" and a drain electrode "D" of the transistor TR is positioned on the interlayer insulating layer 14. The source electrode "S" and the drain electrode "D" are respectively connected to the source region and the drain region of the semiconductor layer "A" through contact holes formed in the interlayer insulating layer 14 and the gate insulating layer 13. The data conductor, for example, may include a metal, such as aluminum (Al), copper (Cu), silver (Ag), molybdenum (Mo), chromium (Cr), gold (Au), platinum (Pt), palladium (Pd), tantalum (Ta), tungsten (W), titanium (Ti), nickel (Ni), etc., or a metal alloy thereof.

A passivation layer 15 is positioned on the data conductor. The passivation layer 15 may include an organic insulating material. A pixel electrode PE is positioned on the passivation layer 15. The pixel electrode PE is connected to the drain electrode "D" through a contact hole formed in the passivation layer 15, thereby receiving a data signal controlling luminance of the organic light emitting diode OLED.

A pixel definition layer 16 is positioned on the passivation layer 15. The pixel definition layer 16 has an opening overlapping the pixel electrode PE. An emission layer EL is positioned on the pixel electrode PE in the opening of the pixel definition layer 16, and a common electrode CE is positioned on the emission layer EL. The pixel electrode PE, the emission layer EL, and the common electrode CE together form the organic light emitting diode OLED. In an embodiment, the pixel electrode PE may be an anode of the organic light emitting diode OLED, and the common electrode CE may be a cathode of the organic light emitting diode OLED. The common electrode CE may include a transparent conductive material, such as indium tin oxide (ITO), indium zinc oxide (IZO), etc.

A thin film encapsulation layer 17 protecting the organic light emitting diode OLED may be positioned on the common electrode CE.

In an embodiment, a touch sensor layer 18 may be positioned on the thin film encapsulation layer 17. The touch sensor layer 18 may include touch electrodes formed of a transparent conductive material, such as ITO, IZO, a metal mesh, etc., and the touch electrodes may be formed of a single layer or multiple layers.

In an embodiment, a polarization layer 19 for reducing reflection of external light may be positioned on the touch sensor layer 18. A protection layer 110 for protecting the display panel 10 may be positioned on the polarization layer 19. A protection layer 120 and/or a functional sheet for protecting the display panel 10 may be positioned under the substrate 11.

Although it is described that the display device may be an organic light emitting diode display, the display device may be, for example, a liquid crystal display including a liquid crystal layer.

While this invention has been described in connection with what are presently considered to be some practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A foldable display device comprising a display panel including a bending portion, and a folding unit supporting the display panel, the foldable display device being capable of being in-folded and out-folded, wherein the folding unit includes:

a first supporting plate including a first supporting portion;

a second supporting plate including a second supporting portion spaced apart from the first supporting portion;

a first elastic member including a first wing portion protruded from the first supporting portion; and a second elastic member including a second wing portion protruded from the second supporting portion, and the bending portion includes a first portion attached to the first wing portion and a second portion attached to the second wing portion.

2. The foldable display device of claim 1, wherein the first wing portion and the second wing portion are respectively protruded from the first supporting portion and the second supporting portion in a direction to face each other.

3. The foldable display device of claim 2, wherein the first wing portion and the second wing portion each has a thickness that decreases farther away from the first supporting portion and the second supporting portion, respectively.

4. The foldable display device of claim 3, wherein, in an unfolded state of the foldable display device, the first wing portion and the second wing portion each has a trapezoidal cross-sectional shape.

5. The foldable display device of claim 3, wherein, in an unfolded state of the foldable display device, the first wing portion and the second wing portion each has a cross-sectional shape in which a slope of a lower surface gradually decreases farther away from the first supporting portion and the second supporting portion, respectively.

6. The foldable display device of claim 3, wherein, in an unfolded state of the foldable display device, the first wing portion and the second wing portion each has a triangular cross-sectional shape.

7. The foldable display device of claim 1, wherein, in an unfolded state of the foldable display device, an upper surface of the first wing portion and an upper surface of the first supporting portion form a flat surface, and an upper surface of the second wing portion and an upper surface of the second supporting portion form a flat surface.

8. The foldable display device of claim 1, wherein, in an unfolded state of the foldable display device, a first distance between the first supporting portion and the second supporting portion is equal to or larger than $\pi R$, where $\pi$ is pi, and R is a curvature of the bending portion during out-folding of the foldable display device.

9. The foldable display device of claim 8, wherein, in the unfolded state of the foldable display device, a second distance between the first wing portion and the second wing portion is larger than 0 and smaller than $\pi R$.

10. The foldable display device of claim 1, wherein the first elastic member and the second elastic member are respectively positioned over at least a part of facing edges of the first supporting portion and the second supporting portion.

11. The foldable display device of claim 1, wherein
the first elastic member includes a first fixing portion coupled to the first supporting portion, and
the second elastic member includes a second fixing portion coupled to the second supporting portion.

12. The foldable display device of claim 1, wherein the display panel includes a first flat portion attached to the first supporting portion and a second flat portion attached to the second supporting portion.

13. The foldable display device of claim 12, wherein the bending portion is positioned between the first flat portion and the second flat portion.

14. The foldable display device of claim 1, further comprising a first hinge and a second hinge positioned at respective sides of the first supporting plate and the second supporting plate,
wherein the first supporting plate includes a first step portion positioned at respective sides of the first supporting portion, the second supporting plate includes a second step portion positioned at respective sides of the second supporting portion, and
the first hinge and the second hinge respectively include a first hinge pin coupled to the first step portion and a second hinge pin coupled to the second step portion.

15. A foldable display device comprising a display panel and a folding unit, the foldable display device being capable of being folded in an out-folding state in which the display panel is exposed to an outside and an in-folding state in which the display panel is positioned inside,
wherein the folding unit includes:
a first supporting plate and a second supporting plate forming a pair with each other; and
a first elastic member and a second elastic member respectively positioned at facing edges of the first supporting plate and the second supporting plate,
wherein a portion of the display panel is attached to the first elastic member and the second elastic member.

16. The foldable display device of claim 15, wherein the display panel includes a first flat portion, a second flat portion, and a bending portion between the first flat portion and the second flat portion, and at least a portion of the bending portion is attached to the first elastic member and the second elastic member.

17. The foldable display device of claim 16, wherein
the first supporting plate includes a first supporting portion, the second supporting plate includes a second supporting portion spaced apart from the first supporting portion, and
the first elastic member is fixed to the first supporting portion, and the second elastic member is fixed to the second supporting portion.

18. The foldable display device of claim 17, wherein
the first elastic member includes a first fixing portion coupled to the first supporting portion, and a first wing portion protruded from the first supporting portion, and
the second elastic member includes a second fixing portion coupled to the second supporting portion, and a second wing portion protruded from the second supporting portion.

19. The foldable display device of claim 18, wherein the bending portion includes a first portion attached to the first wing portion, a second portion attached to the second wing portion, and a third portion positioned between the first portion and the second portion.

20. The foldable display device of claim 18, wherein the first wing portion and the second wing portion each has a thickness that decreases farther away from the first supporting portion and the second supporting portion, respectively.

* * * * *